United States Patent
Ogihara et al.

(10) Patent No.: US 9,984,891 B2
(45) Date of Patent: May 29, 2018

(54) METHOD FOR FORMING ORGANIC FILM AND METHOD FOR MANUFACTURING SUBSTRATE FOR SEMICONDUCTOR APPARATUS

(71) Applicant: SHIN-ETSU CHEMICAL CO., LTD., Tokyo (JP)

(72) Inventors: Tsutomu Ogihara, Jyoetsu (JP); Rie Kikuchi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 15/451,727

(22) Filed: Mar. 7, 2017

(65) Prior Publication Data

US 2017/0309493 A1    Oct. 26, 2017

(30) Foreign Application Priority Data

Apr. 21, 2016   (JP) .................. 2016-085123

(51) Int. Cl.
| | |
|---|---|
| *H01L 21/311* | (2006.01) |
| *H01L 21/308* | (2006.01) |
| *G03F 7/00* | (2006.01) |
| *G03F 7/09* | (2006.01) |
| *G03F 7/11* | (2006.01) |

(Continued)

(52) U.S. Cl.
CPC ........ *H01L 21/3081* (2013.01); *G03F 7/0002* (2013.01); *G03F 7/091* (2013.01); *G03F 7/094* (2013.01); *G03F 7/11* (2013.01); *G03F 7/162* (2013.01); *G03F 7/168* (2013.01); *G03F 7/2037* (2013.01); *G03F 7/325* (2013.01); *G03F 7/327* (2013.01); *H01L 21/0228* (2013.01); *H01L 21/0276* (2013.01); *H01L 21/02118* (2013.01); *H01L 21/02271* (2013.01); *H01L 21/02282* (2013.01); *H01L 21/02318* (2013.01); *H01L 21/02348* (2013.01); *H01L 21/3065* (2013.01); *H01L 21/3086* (2013.01);

(Continued)

(58) Field of Classification Search
CPC .................................. H01L 21/3081
USPC .......................................... 438/703
See application file for complete search history.

(56) References Cited

U.S. PATENT DOCUMENTS 5,158,854 A * 10/1992 Imamura ............... G03F 7/0757
                                                       430/165
5,205,965 A *  4/1993 Uetani ............... C08G 73/0266
                                                       252/500

(Continued)

FOREIGN PATENT DOCUMENTS

| JP | 2004-310019 A | 11/2004 |
|---|---|---|
| JP | 2004-335873 A | 11/2004 |

(Continued)

*Primary Examiner* — Jami M Valentine
(74) *Attorney, Agent, or Firm* — Oliff PLC

(57) ABSTRACT

The present invention provides a method for forming an organic film, including: forming a coating film by spin coating of an organic film-forming composition onto a substrate having an uneven pattern, and thereafter subjecting the substrate to a vibration treatment, and after or simultaneously with the vibration treatment, insolubilizing the coating film to an organic solvent to form the organic film. This provides a method for forming an organic film that can fill an uneven pattern on a substrate to highly flatten a substrate at low cost in a production step of a semiconductor apparatus, etc.

14 Claims, 2 Drawing Sheets

(51) Int. Cl.
  *G03F 7/16*    (2006.01)
  *G03F 7/20*    (2006.01)
  *G03F 7/32*    (2006.01)
  *H01L 21/02*   (2006.01)
  *H01L 21/027*  (2006.01)
  *H01L 21/3065* (2006.01)

(52) U.S. Cl.
  CPC .. *H01L 21/31116* (2013.01); *H01L 21/31138* (2013.01); *H01L 21/31144* (2013.01)

(56) References Cited

U.S. PATENT DOCUMENTS

| | | | |
|---|---|---|---|
| 5,328,809 A * | 7/1994 | Holmes | C07C 43/2055 427/272 |
| 2001/0021760 A1 * | 9/2001 | Matsuki | C07F 7/025 528/10 |
| 2004/0021745 A1 * | 2/2004 | Mouri | B41J 2/161 347/68 |
| 2004/0191479 A1 | 9/2004 | Hatakeyama et al. | |
| 2004/0265745 A1 | 12/2004 | Sho et al. | |
| 2006/0210915 A1 | 9/2006 | Takei et al. | |
| 2007/0135698 A1 * | 6/2007 | Shah | C12Q 1/006 600/348 |
| 2007/0227907 A1 * | 10/2007 | Shah | G01N 27/307 205/777.5 |
| 2007/0238300 A1 | 10/2007 | Ogihara et al. | |
| 2009/0136869 A1 | 5/2009 | Ogihara et al. | |
| 2009/0311624 A1 | 12/2009 | Horiguchi et al. | |
| 2011/0042661 A1 * | 2/2011 | Endo | C08G 61/12 257/40 |
| 2012/0252143 A1 * | 10/2012 | Otsuka | H01L 51/0016 438/22 |
| 2013/0302990 A1 | 11/2013 | Watanabe et al. | |
| 2013/0337649 A1 | 12/2013 | Tachibana et al. | |
| 2014/0335692 A1 | 11/2014 | Nonaka et al. | |

FOREIGN PATENT DOCUMENTS

| | | | |
|---|---|---|---|
| JP | 2005213105 A * | 8/2005 | |
| JP | 2005-292528 A | 10/2005 | |
| JP | 2007-302873 A | 11/2007 | |
| JP | 2008-065081 A | 3/2008 | |
| JP | 2008-242492 A | 10/2008 | |
| JP | 2009-126940 A | 6/2009 | |
| JP | 2013-253227 A | 12/2013 | |
| JP | 2014-024831 A | 2/2014 | |
| JP | 2014-219559 A | 11/2014 | |
| WO | 2008/026468 A1 | 3/2008 | |

* cited by examiner (A)

(B)

(C)

(D)

METHOD FOR FORMING ORGANIC FILM AND METHOD FOR MANUFACTURING SUBSTRATE FOR SEMICONDUCTOR APPARATUS

TECHNICAL FIELD

The present invention relates to a method for forming an organic film that can be extremely flat and can be used for fine processing of a semiconductor apparatus and so on, and a method for manufacturing a substrate for a semiconductor apparatus by using the method for forming an organic film.

BACKGROUND ART

Improvements in processing performance of semiconductor apparatuses have been led by miniaturization of pattern sizes in lithography technology on the basis of shifts to shorter wavelengths of light sources. The shift to shorter wavelength, however, became slow since an ArF light source had appeared, and the improvement alternate to the miniaturization has been necessary. Accordingly, development of semiconductor apparatus with a three-dimensional structure, in which transistors are arranged in higher density and the performance of semiconductor apparatuses can be improved thereby, has been proceeding. In a substrate of the semiconductor apparatus having such a three-dimensional structure, the circuit pattern is formed to have a deeper and finer structure compared to that of a previous substrate, whereby a practical process margin cannot be prepared by a lithography technology that is optimized to a planar structure formed in the previous arts. Accordingly, the process margin have to be ensured by forming a flat surface using a material that can flatten a substrate having a three-dimensional structure, and then patterning the flat surface by a lithography technology.

As the technology that can form such a flat surface, many technologies to form flattening films from spin coating type organic films have been already known (Patent Literatures 1 to 5). The organic films formed from such a material, however, cannot be applied to all of the patterns of the substrate for manufacturing a semiconductor apparatus. Additions of liquid additives such as polyether polyol and polyacetal have been also proposed (Patent Literatures 6 and 7). Such an additive, however, generally lacks dry etching resistance. Accordingly, when this remains in a coating film, the coating film can lack dry etching resistance in processing of a substrate, and can lack the dry etching resistance property of an organic film for processing a substrate. The utilized flattening method also include a method in which unevenness on a substrate is filled and then flattened by chemical mechanical polishing (CMP) process (Patent Literature 8), but the CMP is a costly process. In these situations, it has been demanded a method for highly flattening a substrate for manufacturing a semiconductor apparatus by using an organic film at low cost.

CITATION LIST

Patent Documents

Patent Document 1: Japanese Unexamined Patent Application Publication (Kokai) No. 2005-292528
Patent Document 2: Japanese Unexamined Patent Application Publication (Kokai) No. 2008-065081
Patent Document 3: Japanese Unexamined Patent Application Publication (Kokai) No. 2008-242492
Patent Document 4: Japanese Unexamined Patent Application Publication (Kokai) No. 2014-024831
Patent Document 5: Japanese Unexamined Patent Application Publication (Kokai) No. 2014-219559
Patent Document 6: pamphlet of International Patent Laid-Open Publication No. WO 2008/026468
Patent Document 7: Japanese Unexamined Patent Application Publication (Kokai) No. 2013-253227
Patent Document 8: Japanese Unexamined Patent Application Publication (Kokai) No. 2004-335873

SUMMARY OF INVENTION

Technical Problem

The present invention was accomplished in view of the above-described problems. It is an object of the present invention to provide a method for forming an organic film that can fill an uneven pattern on a substrate to highly flatten the substrate at low cost in a production process of a semiconductor apparatus, etc.

Solution to Problem

To solve the foregoing problems, the present invention provides a method for forming an organic film, comprising:
forming a coating film by spin coating of an organic film-forming composition onto a substrate having an uneven pattern, and thereafter
subjecting the substrate to a vibration treatment, and
after or simultaneously with the vibration treatment, insolubilizing the coating film to an organic solvent to form the organic film.

Such a method can form an organic film that fills an uneven pattern on a substrate to highly flatten the substrate at low cost in a production process of a semiconductor apparatus, etc.

It is preferable that the vibration treatment be performed by applying a vibration having a frequency of 0.01 Hz to 10 GHz.

The treatment to apply a vibration having such a frequency can fluidize a coating film efficiently, and can form a state with the smallest surface area, that is, an extremely flat organic film.

The insolubilizing is preferably a treatment selected from a heat treatment at 50° C. or more and 500° C. or less, an ultraviolet irradiating treatment using ultraviolet having a wavelength of 400 nm or less, an electron beam irradiating treatment, and a combination of these treatments.

When the insolubilizing is performed by such a means, it is possible to form an organic film with the flat state being kept.

It is preferable that the organic film-forming composition contain an aromatic ring-containing resin.

In the inventive method for forming an organic film, the organic film-forming composition which contains an aromatic ring-containing resin, for example, can be favorably used.

The present invention also provides a method for manufacturing a substrate for a semiconductor apparatus, comprising: forming an organic film on a substrate having an uneven pattern by using the foregoing method; forming a silicon-containing resist under layer film on the organic film by using a composition for forming a silicon-containing resist under layer film; forming a resist upper layer film on the silicon-containing resist under layer film by using a photoresist composition; forming a circuit pattern in the resist upper layer film; transferring the pattern to the silicon-containing resist under layer film by dry etching using the resist upper layer film having the formed pattern as a mask; transferring the pattern to the organic film by dry etching using the silicon-containing resist under layer film having the transferred pattern as a mask; and transferring the pattern to the substrate by dry etching using the organic film having the transferred pattern as a mask.

The present invention also provides a method for manufacturing a substrate for a semiconductor apparatus, comprising: forming an organic film on a substrate having an uneven pattern by using the foregoing method; forming a silicon-containing resist under layer film on the organic film by using a composition for forming a silicon-containing resist under layer film; forming an organic antireflection film on the silicon-containing resist under layer film; forming a resist upper layer film on the organic antireflection film by using a photoresist composition to provide a four-layer resist film; forming a circuit pattern in the resist upper layer film; transferring the pattern to the organic antireflection film and the silicon-containing resist under layer film by dry etching using the resist upper layer film having the formed pattern as a mask; transferring the pattern to the organic film by dry etching using the organic antireflection film and the silicon-containing resist under layer film having the transferred pattern as a mask; and transferring the pattern to the substrate by dry etching using the organic film having the transferred pattern as a mask.

The present invention also provides a method for manufacturing a substrate for a semiconductor apparatus, comprising: forming an organic film on a substrate having an uneven pattern by using the foregoing method; forming any of inorganic hard mask selected from a silicon oxide film, a silicon nitride film, a silicon oxynitride film, an amorphous silicon film, and a titanium nitride film on the organic film; forming a resist upper layer film on the inorganic hard mask by using a photoresist composition; forming a circuit pattern in the resist upper layer film; transferring the pattern to the inorganic hard mask by dry etching using the resist upper layer film having the formed pattern as a mask; transferring the pattern to the organic film by dry etching using the inorganic hard mask having the transferred pattern as a mask; and transferring the pattern to the substrate by dry etching using the organic film having the transferred pattern as a mask.

The present invention also provides a method for manufacturing a substrate for a semiconductor apparatus, comprising: forming an organic film on a substrate having an uneven pattern by using the foregoing method; forming any of inorganic hard mask selected from a silicon oxide film, a silicon nitride film, a silicon oxynitride film, an amorphous silicon film, and a titanium nitride film on the organic film; forming an organic antireflection film or a multi-layer resist film composed of an organic film and a silicon-containing resist under layer film on the inorganic hard mask; forming a resist upper layer film on the organic antireflection film or the multi-layer resist film by using a photoresist composition; forming a circuit pattern in the resist upper layer film; transferring the pattern to the inorganic hard mask by dry etching using the resist upper layer film having the formed pattern as a mask via a pattern transfer to the organic antireflection film or the multi-layer resist film; transferring the pattern to the organic film formed on the substrate by dry etching using the inorganic hard mask having the transferred pattern as a mask; and transferring the pattern to the substrate by dry etching using the organic film having the transferred pattern as a mask.

As described above, the organic film formed by the method of the present invention has excellent flattening characteristics, and accordingly, by using this organic film combined with various film materials in a multi-layer resist process such as a two-layer resist process, a three-layer resist process using a silicon-containing resist under layer film, and a four-layer resist process using a silicon-containing resist under layer film and an organic antireflective film, it is possible to transfer a pattern on the upper layer photoresist (resist upper layer film) to a substrate with high accuracy to form a pattern on the substrate. That is, the inventive method for manufacturing a substrate for a semiconductor apparatus can manufacture a highly precise substrate for a semiconductor apparatus.

In this case, the inorganic hard mask is preferably formed by a chemical vapor deposition (CVD) method or an atomic layer deposition (ALD) method.

In the inventive method for manufacturing a substrate for a semiconductor apparatus, the inorganic hard mask can be formed by such a method, for example.

In the forming of the circuit pattern, it is preferable that the circuit pattern be formed by a method selected from a lithography method with a high energy beam having a wavelength of 10 nm or more and 300 nm or less, a direct drawing method with an electron beam, a nano-imprinting method, and a combination of these methods.

In the forming of the circuit pattern, it is also preferable that the circuit pattern be developed by alkaline development or organic solvent development.

In the inventive method for manufacturing a substrate for a semiconductor apparatus, such a means for forming a circuit pattern and a means for development can be favorably used.

It is also preferable that the substrate contain any of a metal film, a metal carbide film, a metal oxide film, a metal nitride film, and a metal oxynitride film.

It is also preferable that the metal contained in the substrate is selected from silicon, titanium, tungsten, hafnium, zirconium, chromium, germanium, copper, aluminum, indium, gallium, arsenic, palladium, iron, tantalum, iridium, molybdenum, and alloy of these metals.

The inventive method for manufacturing a substrate for a semiconductor apparatus can process such a substrate to manufacture a substrate for a semiconductor apparatus.

Advantageous Effects of Invention

As described above, the present invention can fill an uneven pattern on a substrate to form an organic film that can highly flatten the substrate. The present invention can highly flatten a substrate without using CMP, which is a costly process, thereby making it possible to flatten a substrate at low cost. The organic film formed by the inventive method has excellent flattening characteristics, and is very useful for manufacturing a semiconductor apparatus thereby. By using this organic film combined with various film materials in a multi-layer resist process such as a two-layer resist process, a three-layer resist process using a silicon-containing resist under layer film, and a four-layer resist process using a silicon-containing resist under layer film and an organic antireflective film, it is possible to transfer a pattern on the upper layer photoresist (resist upper layer film) to a substrate with high accuracy to form a pattern on the substrate. That is, the inventive method for manufacturing a substrate for a semiconductor apparatus can manufacture a highly precise substrate for a semiconductor apparatus.

DESCRIPTION OF EMBODIMENTS

As described above, it has been demanded to develop a method for forming an organic film that can fill an uneven pattern on a substrate to highly flatten the substrate at low cost in a production process of a semiconductor apparatus, etc.

Previously, in a method for flattening a substrate having an uneven pattern such as a substrate on which a part of or whole semiconductor circuit is formed, the uneven pattern on the substrate surface have been filled with an organic film to form a flat surface by spin coating of an organic film-forming composition onto the substrate and by baking subsequently. Although this method can fill minute unevenness on the surface, it is difficult to form a flat surface that is uniform over the entire surface of the substrate including a portion with high pattern density and a portion with low pattern density to be filled. Generally, the coated composition forms a coating film having unevenness in a shape reflecting the uneven pattern formed on the substrate. In a process for forming a semiconductor circuit, this coating film is generally insolubilized prior to the step for forming a next film. The present inventors have diligently studied on the flattening of a substrate and consequently found that the state of the smallest surface area, i.e., an extremely flat organic film can be formed by the processes of applying an organic film-forming composition to form a coating film, and thereafter, applying vibration energy to the coating film to fluidize the coating film before or simultaneously with the insolubilizing step; thereby brought the present invention to completion.

That is, the present invention is a method for forming an organic film, comprising:

forming a coating film by spin coating of an organic film-forming composition onto a substrate having an uneven pattern, and thereafter subjecting the substrate to a vibration treatment, and after or simultaneously with the vibration treatment, insolubilizing the coating film to an organic solvent to form the organic film.

Hereinafter, the present invention will be specifically described, but the present invention is not limited thereto.

<Method for Forming Organic Film>

Hereinafter, the present invention will be described with referring to FIGS.

Figure 1:
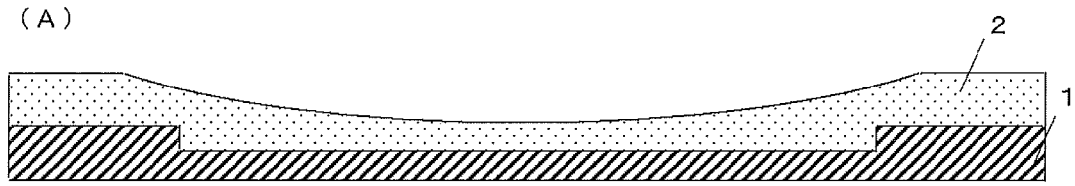
FIG. 1 is a flow diagram showing an example to form an organic film onto a substrate having a space pattern by the method for forming an organic film of the present invention.
Figure 1:
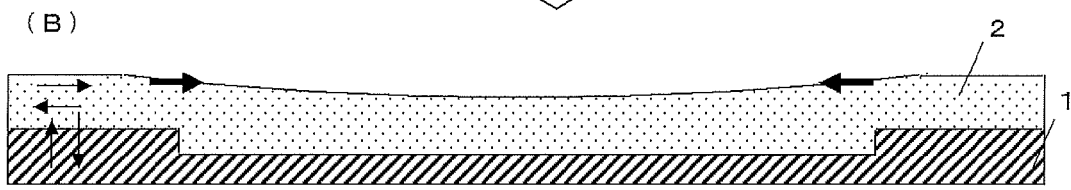
Figure 1:
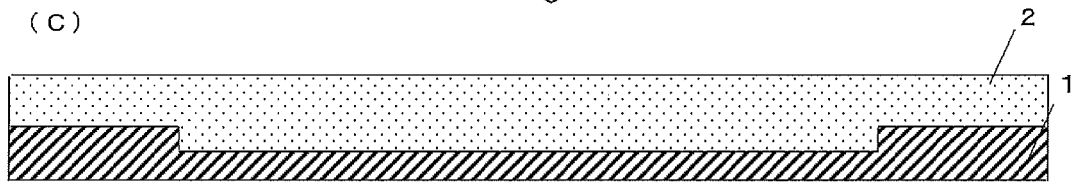
Figure 1:
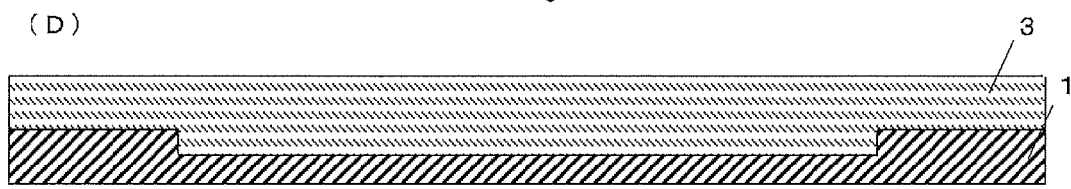

FIG. 1 is a flow diagram showing an example to form an organic film onto a substrate having a space pattern by the method for forming an organic film of the present invention. In the method of FIG. 1, an organic film-forming composition is spin coated onto the substrate 1 to form the coating film 2 at first. At this time, the coating film 2 is formed in a shape having an unevenness, reflecting a shape of the substrate due to an uneven pattern on the substrate 1 (FIG. 1(A)). This coating film 2 is composed of a resin, a solvent which cannot volatilize in the spin coating and remained, etc. The substrate having this coating film formed thereon is subjected to a vibration treatment, which applies a vibration. By vibrating the substrate 1, the vibration is applied to the coating film 2 to liquefy the coating film 2, and fluidizes the coating film 2 (mainly, the resin in coating film 2) (FIG. 1(B)). As the result, the unevenness is canceled, thereby forming the flat coating film 2 (FIG. 1(C)). At the end, this flat coating film 2 is insolubilized by a treatment with either or both of heat and light, and the flat organic film 3 can be formed thereby (FIG. 1(D)). Onto this insolubilized organic film 3, it is possible to form another coating film by spin coating of a coating film-forming composition such as a composition for forming a silicon-containing resist under layer film that will be described later. In the method of FIG. 1, the vibration treatment of the substrate 1 is performed after forming the coating film 2 and before insolubilizing the coating film 2, but it is also possible to perform the vibration treatment of the substrate 1 simultaneously with the insolubilizing treatment after forming the coating film 2.

Figure 2:
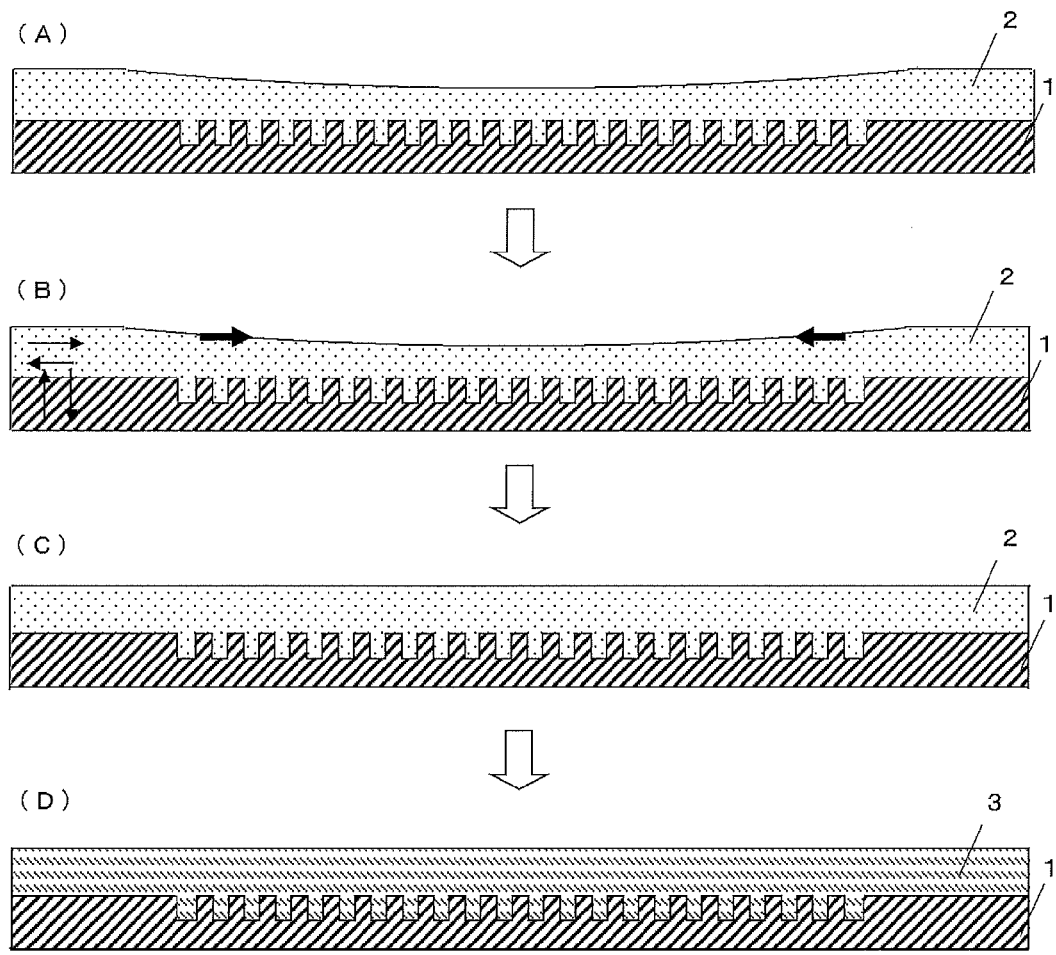
FIG. 2 is a flow diagram showing an example to form an organic film onto a substrate having a line pattern by the method for forming an organic film of the present invention.

FIG. 2 is a flow diagram showing an example to form an organic film onto a portion of a fine pattern over a wide area on a substrate with a line pattern by the method for forming an organic film of the present invention. In the method of FIG. 2, an organic film-forming composition is spin coated onto the substrate 1 to form the coating film 2 at first. At this time, the coating film 2 is formed in a shape having an unevenness which reflects a shape of the substrate due to an uneven pattern on the substrate when the pattern has a large pitch as shown in FIG. 1. However, when the pattern is fine, for example, having a half pitch of 200 nm or less, the coating film 2 is formed with the central part of the pattern being smoothly concaved (the entire part having a pattern is in a moderately concave shape), without reflecting individual patterns (FIG. 2(A)). The substrate having this coating film formed thereon is subjected to a vibration treatment. By vibrating the substrate 1 in the same way as described above, the vibration is applied to the coating film 2 to cancel the unevenness, thereby forming the flat coating film 2 (FIG. 2(B) and FIG. 2(C)). At the end, this flat coating film 2 is insolubilized by a treatment with either or both of heat and light, and the flat organic film 3 can be formed thereby (FIG. 2(D)). Onto this insolubilized organic film 3, it is possible to form another coating film by spin coating of a coating film-forming composition such as a composition for forming a silicon-containing resist under layer film that will be described later. In the method of FIG. 2, the vibration treatment of the substrate 1 is performed after forming the coating film 2 and before insolubilizing the coating film 2, but it is also possible to perform the vibration treatment of the substrate 1 simultaneously with the insolubilizing treatment after forming the coating film 2.

Hereinafter, each step of the inventive method for forming an organic film will be described more specifically.

[Formation of Coating Film]

In the inventive method for forming an organic film, an organic film-forming composition is spin coated onto a substrate having an uneven pattern to form a coating film at first. The substrate having an uneven pattern is not particularly limited, and a substrate such as the ones having a space pattern and/or a line pattern can be used. The organic film-forming composition used in the present invention is not particularly limited, but it is preferable to use the organic film-forming composition which contains an aromatic ring-containing resin. The spin coating is not particularly limited, and can be performed by any known method using a spin coater, etc.

[Vibration Treatment]

Figure 3:
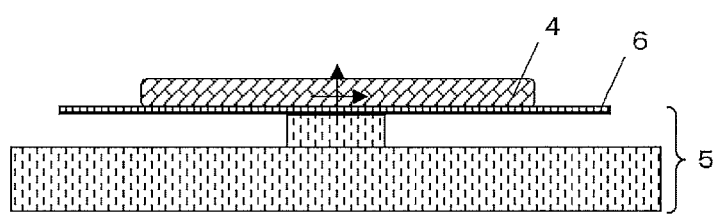
FIG. 3 is an explanatory drawing showing an example of a vibration treatment in the method for forming an organic film of the present invention.

In the inventive method for forming an organic film, the substrate is subjected to a vibration treatment after forming a coating film and before the insolubilizing treatment or simultaneously with the insolubilizing treatment. FIG. 3 is an explanatory drawing showing an example of a vibration treatment. The method for applying a vibration may be exemplified by a method in which the vibration face 6 of vibration generating device 5 is brought into close contact with the substrate 4 after forming the coating film thereon, and the substrate 4 having the coating film is vibrated by air pressure or electric-power. For example, ultrasound by an ultrasonic generator can be propagated to a substrate via an oscillator.

In the vibration treatment, it is preferable to apply a vibration having a frequency of 0.01 Hz to 10 GHz. The treatment to apply a vibration having such a frequency can fluidize a coating film efficiently, and can form a state with the smallest surface area, that is an extremely flat organic film.

[Insolubilizing Treatment]

In the inventive method for forming an organic film, a coating film is formed, and thereafter, the coating film is insolubilized to an organic solvent. The insolubilizing treatment is preferably any of a heat treatment at 50° C. or more and 500° C. or less, an ultraviolet irradiating treatment using ultraviolet having a wavelength of 400 nm or less, an electron beam irradiating treatment, or a combination of these treatments. When the insolubilizing treatment is performed by such a means, it is possible to form an organic film with the flat state being kept.

Through the foregoing steps, an insolubilized organic film can be formed on a substrate having an uneven pattern. The thickness of this organic film can be appropriately selected depending on the depth of a pattern, but is preferably in a range of 10 to 20,000 nm, particularly 20 to 15,000 nm.

When using the organic film formed as described above in a multi-layer resist process, it is possible to form a silicon-containing resist under layer film, a resist upper layer film containing no silicon (single layer resist film), and an inorganic hard mask such as a silicon oxide film, a silicon nitride film, a silicon oxynitride film, an amorphous silicon film, and a titanium nitride film thereon. The inventive method can highly flatten a substrate without using CMP, which is a costly process, and can flatten a substrate at low cost thereby.

<Method for Manufacturing Substrate for Semiconductor Apparatus>

The present invention provides a method for manufacturing a substrate for a semiconductor apparatus, comprising: forming an organic film on a substrate having an uneven pattern by using the inventive method for forming an organic film described above; forming a silicon-containing resist under layer film on the organic film by using a composition for forming a silicon-containing resist under layer film; forming a resist upper layer film on the silicon-containing resist under layer film by using a photoresist composition; forming a circuit pattern in the resist upper layer film; transferring the pattern to the silicon-containing resist under layer film by dry etching using the resist upper layer film having the formed pattern as a mask; transferring the pattern to the organic film by dry etching using the silicon-containing resist under layer film having the transferred pattern as a mask; and transferring the pattern to the substrate by dry etching using the organic film having the transferred pattern as a mask.

In the inventive method for manufacturing a substrate for a semiconductor apparatus, the substrate preferably contains any of a film selected from a metal film, a metal carbide film, a metal oxide film, a metal nitride film, and a metal oxynitride film.

The substrate is preferably composed of metal selected from silicon, titanium, tungsten, hafnium, zirconium, chromium, germanium, copper, aluminum, indium, gallium, arsenic, palladium, iron, tantalum, iridium, molybdenum, and alloy of these metals.

In the inventive method for manufacturing a substrate for a semiconductor apparatus, the foregoing organic film can be applied as a sacrificial film.

As the organic film-forming composition, it is preferable to use a composition which contains an aromatic ring-containing resin as described above. For the use of 193 nm exposure, material that contains large amount of aromatic groups and have high substrate etching resistance sometimes increases the k-value and increases the substrate reflection, but the reflection of a substrate can be decreased to 0.5% or less by suppressing the reflection by using a silicon-containing resist under layer film. In extreme ultraviolet ray (EUV) exposure, a fine pattern can be formed by using an organic film material that contains large amount of aromatic groups and have high substrate etching resistance.

As the silicon-containing resist under layer film, a polysiloxane base coating film is preferably used. When the silicon-containing resist under layer film has an effect as an antireflection film, the reflection can be suppressed. Illustrative examples thereof include silicon-containing resist under layer films obtained from compositions described in Japanese Unexamined Patent Application Publication Nos. 2004-310019, 2007-302873, 2009-126940, etc.

The photoresist composition for forming the resist upper layer film may be any of a positive-type and a negative-type, and the same composition as a generally used photoresist composition may be used. When the resist upper layer film is formed from the photoresist composition, a spin coating method is preferably used as in the case of forming the foregoing organic film. After spin coating of the photoresist composition, prebaking is carried out, preferably at 60 to 180° C. for 10 to 300 seconds. Thereafter, exposure, post-exposure bake (PEB), and development are carried out according to respective conventional methods, and a resist pattern (a circuit pattern) can be obtained thereby. The thickness of the resist upper layer film is not particularly limited, but is preferably 30 to 500 nm, particularly 50 to 400 nm.

The circuit pattern is preferably formed by a method selected from a lithography method with a high energy beam having a wavelength of 10 nm or more and 300 nm or less, a direct drawing method with an electron beam, a nanoimprinting method, and a combination of these methods.

The light for exposure can include a high energy beam having a wavelength of 300 nm or less, specifically excimer laser beams each having a wavelength of 248 nm, 193 nm, and 157 nm; a soft X-ray having a wavelength of 3 to 20 nm; so called EUV light; an electron beam; and a X-ray.

In forming the circuit pattern, the circuit pattern is preferably developed by alkaline development or organic solvent development.

Then, etching is carried out by using the obtained resist pattern as a mask. Dry etching processing of the silicon-containing resist under layer film can be carried out by using a fluorocarbon-base gas and using the foregoing resist pattern as a mask. Subsequently, dry etching processing of the organic film can be carried out by using an oxygen gas or a hydrogen gas, for example, and the silicon-containing resist under layer film pattern (the silicon-containing resist under layer film having a transferred pattern) as a mask.

Subsequent etching of the substrate may be carried out also by a conventional method; and the pattern can be transferred to the substrate by etching with a gas mainly consisting of a fluorocarbon-base gas when the substrate is $SiO_2$, SiN, or a silica-type low-dielectric insulating film; and by etching with a gas mainly consisting of a chlorine-based gas or a bromine-based gas when the substrate is p-Si, Al, or W.

It is also possible to form an organic antireflection film (BARC) on the silicon-containing resist under layer film, and to form the resist upper layer film thereon. That is, the present invention provides a method for manufacturing a substrate for a semiconductor apparatus, comprising: forming an organic film on a substrate having an uneven pattern by using the inventive method for forming an organic film described above; forming a silicon-containing resist under layer film on the organic film by using a composition for forming a silicon-containing resist under layer film; forming an organic antireflection film on the silicon-containing resist under layer film; forming a resist upper layer film on the organic antireflection film by using a photoresist composition to provide a four-layer resist film; forming a circuit pattern in the resist upper layer film; transferring the pattern to the organic antireflection film and the silicon-containing resist under layer film by dry etching using the resist upper layer film having the formed pattern as a mask; transferring the pattern to the organic film by dry etching using the organic antireflection film and the silicon-containing resist under layer film having the transferred pattern as a mask; and transferring the pattern to the substrate by dry etching using the organic film having the transferred pattern as a mask.

It is to be noted that this method can be carried out in the same way as in the foregoing method for manufacturing a substrate for a semiconductor apparatus by using a silicon-containing resist under layer film except for forming the organic antireflection film on the silicon-containing resist under layer film. The organic antireflection film is not particularly limited; any known ones can be used, and can be formed by any known methods such as spin coating.

It is also possible to form an inorganic hard mask such as a silicon oxide film, a silicon nitride film, a silicon oxynitride film, an amorphous silicon film, and a titanium nitride film on the organic film. That is, the present invention provides a method for manufacturing a substrate for a semiconductor apparatus, comprising: forming an organic film on a substrate having an uneven pattern by using the inventive method for forming an organic film described above; forming any of inorganic hard mask selected from a silicon oxide film, a silicon nitride film, a silicon oxynitride film, an amorphous silicon film, and a titanium nitride film on the organic film; forming a resist upper layer film on the inorganic hard mask by using a photoresist composition; forming a circuit pattern in the resist upper layer film; transferring the pattern to the inorganic hard mask by dry etching using the resist upper layer film having the formed pattern as a mask; transferring the pattern to the organic film by dry etching using the inorganic hard mask having the transferred pattern as a mask; and transferring the pattern to the substrate by dry etching using the organic film having the transferred pattern as a mask.

The inorganic hard mask is preferably formed by a CVD method or an ALD method.

Etching of the inorganic hard mask can be carried out by using a fluorocarbon-base gas, for example, and using a resist pattern as a mask. Then, dry etching processing of the organic film can be carried out by using an oxygen gas or a hydrogen gas and an inorganic hard mask pattern as a mask. This method can be carried out in the same way as in the foregoing method for manufacturing a substrate for a semiconductor apparatus by using a silicon-containing resist under layer film except for forming the inorganic hard mask on the organic film instead of the silicon-containing resist under layer film.

It is also possible to form an organic antireflection film or a multi-layer resist film composed of an organic film and a silicon-containing resist under layer film on the inorganic hard mask. That is, the present invention provides a method for manufacturing a substrate for a semiconductor apparatus, comprising: forming an organic film on a substrate having an uneven pattern by using the inventive method for forming an organic film described above; forming any of inorganic hard mask selected from a silicon oxide film, a silicon nitride film, a silicon oxynitride film, an amorphous silicon film, and a titanium nitride film on the organic film; forming an organic antireflection film or a multi-layer resist film composed of an organic film and a silicon-containing resist under layer film on the inorganic hard mask; forming a resist upper layer film on the organic antireflection film or the multi-layer resist film by using a photoresist composition; forming a circuit pattern in the resist upper layer film; transferring the pattern to the inorganic hard mask by dry etching using the resist upper layer film having the formed pattern as a mask via a pattern transfer to the organic antireflection film or the multi-layer resist film; transferring the pattern to the organic film formed on the substrate by dry etching using the inorganic hard mask having the transferred pattern as a mask; and transferring the pattern to the substrate by dry etching using the organic film having the transferred pattern as a mask.

When using the inorganic hard mask such as a silicon oxide film, a silicon nitride film, a silicon oxynitride film, an amorphous silicon film, and a titanium nitride film; it is possible to suppress reflection even in a liquid immersion exposure at a high NA exceeding 1.0 by combining the inorganic hard mask and BARC. The formation of the BARC has one more merit to attain an effect to widen the process latitude immediately above the inorganic hard mask.

It is to be noted that this method can be carried out in the same way as in the foregoing method for manufacturing a substrate for a semiconductor apparatus by using the inorganic hard mask except for forming the organic antireflection film or the multi-layer resist film composed of an organic film and a silicon-containing resist under layer film on the inorganic hard mask.

As described above, the organic film formed by the inventive method has excellent flattening characteristics. Accordingly, by using this organic film combined with various film materials in a multi-layer resist process such as a two-layer resist process, a three-layer resist process using a silicon-containing resist under layer film, and a four-layer resist process using a silicon-containing resist under layer film and an organic antireflective film, it is possible to transfer a pattern on the upper layer photoresist (resist upper layer film) to a substrate with high accuracy to form a pattern on the substrate. That is, the inventive method for manufacturing a substrate for a semiconductor apparatus can manufacture a highly precise substrate for a semiconductor apparatus.

EXAMPLES

Hereinafter, the present invention will be described specifically by showing Synthesis Example, Preparation Example, Examples, and Comparative Examples, but the present invention is not limited thereto. It is to be noted that the weight-average molecular weight (Mw) and number-average molecular weight (Mn) were measured as the molecular weight by gel permeation chromatography (GPC) in terms of polystyrene, and the dispersity (Mw/Mn) was derived therefrom.

Synthesis Example 1

Into a 300 mL flask, 200 g of fluorenebisphenol, 75 g of 37% aqueous formalin, and 5 g of oxalic acid were introduced, and reacted at 100° C. for 24 hours while stirring. After the reaction, this was dissolved into 500 mL of methyl isobutyl ketone, and washed with water sufficiently to remove the catalyst and metal impurities. Then, the solvent was removed under reduced pressure, and the pressure was decreased to 2 mmHg at 150° C. to remove the water and the unreacted monomer, whereby 135 g of Polymer 1 shown below was obtained. Its molecular weight (Mw) and dispersity (Mw/Mn) were determined by GPC as follows:
molecular weight (Mw): 6,500
dispersity (Mw/Mn): 5.20

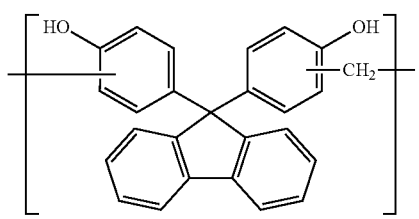

Polymer 1

Preparation Example 1

Into 100 parts by mass of propylene glycol monomethyl ether acetate (hereinafter, PGMEA) containing 0.1% by mass of FC-430 (product of Sumitomo 3M Ltd.), 10 parts by mass of the foregoing Polymer 1 was dissolved, and filtered through a filter made of a fluorine resin having a pore size of 0.1 μm to prepare a solution of an organic film-forming composition (SOL-1).

Example 1

Substrate A made from silicon having an uneven pattern with a height of 0.1 μm and a width of 1 mm formed from silicon dioxide was prepared. Onto this Substrate A, SOL-1 was spin coated to form a coating film, and then a vibration with an oscillation frequency of 38 kHz was applied to the substrate for 5 minutes (a vibration treatment). Subsequently, this was baked at 300° C. for 60 seconds to form an organic film. The flatness between the portion having a pattern and the portion having no pattern was measured with a contact-type step meter α step (manufactured by KLA-Tencor Corporation). The result is shown in Table 1.

Example 2

Substrate B having repeated patterns formed from silicon dioxide, each of which is composed of a pattern having a height of 0.1 μm and a half pitch of 50 nm together with a space of 50 nm, repeated in an area of 1 mm was prepared. The same procedure as in Example 1 was carried out except for using Substrate B to form an organic film, and the flatness was measured. The result is shown in Table 1.

Comparative Example 1

A coating film was formed in the same way as in Example 1 by using Substrate A. Then, this was baked at 300° C. for 60 seconds, without performing the vibration treatment, to form an organic film. The flatness was measured in the same way as in Example 1. The result is shown in Table 1.

Comparative Example 2

The same procedure as in Comparative Example 1 was carried out except for using Substrate B instead of Substrate A to form an organic film, and the flatness was measured. The result is shown in Table 1.

TABLE 1

|  | Examples (with vibration treatment) | Flatness | Comparative Examples (without vibration treatment) | Flatness |
|---|---|---|---|---|
| Substrate A | Example 1 | 5 nm | Comparative Example 1 | 90 nm |
| Substrate B | Example 2 | 4 nm | Comparative Example 2 | 85 nm |

As shown in Table 1, in each of Example 1 and Example 2, in which a vibration was applied to the substrate after forming the coating film and before baking (insolubilizing) thereof, the uneven pattern on the substrate was filled by the organic film, and the substrate could be highly flattened. On the other hand, in each of Comparative Example 1 and Comparative Example 2, which did not perform a vibration treatment to the substrate, the substrate was not highly flattened.

From the above, it was revealed that the inventive method for forming an organic film can form an organic film that can highly flatten a substrate. It was also found that the inventive method can highly flatten a substrate without CMP, which is a costly process, and can flatten a substrate at low cost thereby.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A method for forming an organic film, comprising:
   forming a coating film by spin coating of an organic film-forming composition onto a substrate having an uneven pattern, and thereafter subjecting the substrate to a vibration treatment, and
after or simultaneously with the vibration treatment, insolubilizing the coating film to an organic solvent to form the organic film,
wherein the organic film-forming composition contains an aromatic ring-containing resin.

2. The method for forming an organic film according to claim 1, wherein the vibration treatment is performed by applying a vibration having a frequency of 0.01 Hz to 10 GHz.

3. The method for forming an organic film according to claim 1, wherein the insolubilizing is a treatment selected from a heat treatment at 50° C. or more and 500° C. or less, an ultraviolet irradiating treatment using ultraviolet having a wavelength of 400 nm or less, an electron beam irradiating treatment, and a combination of these treatments.

4. The method for forming an organic film according to claim 2, wherein the insolubilizing is a treatment selected from a heat treatment at 50° C. or more and 500° C. or less, an ultraviolet irradiating treatment using ultraviolet having a wavelength of 400 nm or less, an electron beam irradiating treatment, and a combination of these treatments.

5. A method for manufacturing a substrate for a semiconductor apparatus, comprising: forming an organic film on a substrate having an uneven pattern by using the method according to claim 1; forming a silicon-containing resist under layer film on the organic film by using a composition for forming a silicon-containing resist under layer film; forming a resist upper layer film on the silicon-containing resist under layer film by using a photoresist composition; forming a circuit pattern in the resist upper layer film; transferring the pattern to the silicon-containing resist under layer film by dry etching using the resist upper layer film having the formed pattern as a mask; transferring the pattern to the organic film by dry etching using the silicon-containing resist under layer film having the transferred pattern as a mask; and transferring the pattern to the substrate by dry etching using the organic film having the transferred pattern as a mask.

6. A method for manufacturing a substrate for a semiconductor apparatus, comprising: forming an organic film on a substrate having an uneven pattern by using the method according to claim 1; forming a silicon-containing resist under layer film on the organic film by using a composition for forming a silicon-containing resist under layer film; forming an organic antireflection film on the silicon-containing resist under layer film; forming a resist upper layer film on the organic antireflection film by using a photoresist composition to provide a four-layer resist film; forming a circuit pattern in the resist upper layer film; transferring the pattern to the organic antireflection film and the silicon-containing resist under layer film by dry etching using the resist upper layer film having the formed pattern as a mask; transferring the pattern to the organic film by dry etching using the organic antireflection film and the silicon-containing resist under layer film having the transferred pattern as a mask; and transferring the pattern to the substrate by dry etching using the organic film having the transferred pattern as a mask.

7. A method for manufacturing a substrate for a semiconductor apparatus, comprising: forming an organic film on a substrate having an uneven pattern by using the method according to claim 1; forming any of inorganic hard mask selected from a silicon oxide film, a silicon nitride film, a silicon oxynitride film, an amorphous silicon film, and a titanium nitride film on the organic film; forming a resist upper layer film on the inorganic hard mask by using a photoresist composition; forming a circuit pattern in the resist upper layer film; transferring the pattern to the inorganic hard mask by dry etching using the resist upper layer film having the formed pattern as a mask; transferring the pattern to the organic film by dry etching using the inorganic hard mask having the transferred pattern as a mask; and transferring the pattern to the substrate by dry etching using the organic film having the transferred pattern as a mask.

8. A method for manufacturing a substrate for a semiconductor apparatus, comprising: forming an organic film on a substrate having an uneven pattern by using the method according to claim 1; forming any of inorganic hard mask selected from a silicon oxide film, a silicon nitride film, a silicon oxynitride film, an amorphous silicon film, and a titanium nitride film on the organic film; forming an organic antireflection film or a multi-layer resist film composed of an organic film and a silicon-containing resist under layer film on the inorganic hard mask; forming a resist upper layer film on the organic antireflection film or the multi-layer resist film by using a photoresist composition; forming a circuit pattern in the resist upper layer film; transferring the pattern to the inorganic hard mask by dry etching using the resist upper layer film having the formed pattern as a mask via a pattern transfer to the organic antireflection film or the multi-layer resist film; transferring the pattern to the organic film formed on the substrate by dry etching using the inorganic hard mask having the transferred pattern as a mask; and transferring the pattern to the substrate by dry etching using the organic film having the transferred pattern as a mask.

9. The method for manufacturing a substrate for a semiconductor apparatus according to claim 7, wherein the inorganic hard mask is formed by a CVD method or an ALD method.

10. The method for manufacturing a substrate for a semiconductor apparatus according to claim 8, wherein the inorganic hard mask is formed by a CVD method or an ALD method.

11. The method for manufacturing a substrate for a semiconductor apparatus according to claim 5, wherein the circuit pattern is formed by a method selected from a lithography method with a high energy beam having a wavelength of 10 nm or more and 300 nm or less, a direct drawing method with an electron beam, a nano-imprinting method, and a combination of these methods.

12. The method for manufacturing a substrate for a semiconductor apparatus according to claim 5, wherein the circuit pattern is developed by alkaline development or organic solvent development.

13. The method for manufacturing a substrate for a semiconductor apparatus according to claim 5, wherein the substrate contains any of a metal film, a metal carbide film, a metal oxide film, a metal nitride film, and a metal oxynitride film.

14. The method for manufacturing a substrate for a semiconductor apparatus according to claim 13, wherein the metal contained in the substrate is selected from silicon, titanium, tungsten, hafnium, zirconium, chromium, germanium, copper, aluminum, indium, gallium, arsenic, palladium, iron, tantalum, iridium, molybdenum, and alloy of these metals.

* * * * *